(12) United States Patent
Oboukhov et al.

(10) Patent No.: US 11,513,895 B1
(45) Date of Patent: Nov. 29, 2022

(54) DATA STORAGE DEVICE PROCESSING PROBLEMATIC PATTERNS AS ERASURES

(71) Applicant: Western Digital Technologies, Inc., San Jose, CA (US)

(72) Inventors: Iouri Oboukhov, Rochester, MN (US); Richard L. Galbraith, Rochester, MN (US); Jonas A. Goode, Lake Forest, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/345,434

(22) Filed: Jun. 11, 2021

(51) Int. Cl.
| G06F 11/00 | (2006.01) |
| G06F 11/10 | (2006.01) |
| H03M 13/15 | (2006.01) |
| H03M 13/11 | (2006.01) |
| G06F 3/06 | (2006.01) |

(52) U.S. Cl.
CPC .......... *G06F 11/1068* (2013.01); *G06F 3/064* (2013.01); *G06F 3/0619* (2013.01); *G06F 3/0647* (2013.01); *G06F 3/0679* (2013.01); *H03M 13/1102* (2013.01); *H03M 13/154* (2013.01)

(58) Field of Classification Search
USPC ....................................................... 714/764
See application file for complete search history.

(56) References Cited

U.S. PATENT DOCUMENTS

| 9,923,562 | B1 * | 3/2018 | Vinson .................. G06F 3/0656 |
| 10,552,252 | B2 | 2/2020 | Seokhun et al. |
| 10,567,002 | B2 | 2/2020 | Shutkin et al. |
| 2015/0303943 | A1 * | 10/2015 | Li ....................... G06F 11/1076 |
| | | | 714/758 |
| 2017/0090763 | A1 * | 3/2017 | Horn ..................... G06F 3/0604 |
| 2019/0250987 | A1 * | 8/2019 | Oboukhov ........... H03M 13/255 |
| 2021/0397361 | A1 * | 12/2021 | Xiong ................ G11B 20/1889 |
| 2022/0103188 | A1 * | 3/2022 | Oboukhov ......... H03M 13/1102 |

OTHER PUBLICATIONS

E. Yaakobi, J. Ma, L. Grupp, P. H. Siegel, S. Swanson and J. K. Wolf, "Error characterization and coding schemes for flash memories," 2010 IEEE Globecom Workshops, 2010, pp. 1856-1860, doi: 10.1109/GLOCOMW.2010.5700263. (Year: 2010).*

M. Varsamou, I. Zacharias and T. Antonakopoulos, "Correlated noise estimation and error correction in parallel storage channels," IEEE International Symposium on Signal Processing and Information Technology, 2013, pp. 000484-000489, doi: 10.1109/ISSPIT.2013.6781928. (Year: 2013).*

(Continued)

*Primary Examiner* — Daniel F. McMahon
(74) *Attorney, Agent, or Firm* — Patterson & Sheridan, LLP; Steven H. VerSteeg

(57) ABSTRACT

A data storage device is disclosed comprising a non-volatile storage medium (NVSM). Problematic patterns in a block of input data are identified, and the problematic patterns are relocated from an initial location to an erasure region of the block to generate a modified block. The modified block is erasure encoded into an erasure codeword, at least part of the erasure codeword is stored in the NVSM.

21 Claims, 4 Drawing Sheets

(56) References Cited

OTHER PUBLICATIONS

Ha J et al., "Rate-Compatible Puncturing of Low-Density Parity-Check Codes" IEEE Transactions on Information Theory, IEEE Service Center, Piscataway, NJ, US, vol. 50, No. 11, Nov. 2004 (Nov. 2004), pp. 2824-2836, XP011121167 ISSN: 0018-9448.

Liu et al., "Rate-Compatible LDPC Codes Based on Puncturing and Extension Techniques for Short Block Lengths" Jul. 19, 2014, IEEE, pp. 1-9.

Y. Fang, G. Han, G. Cai, F. C. M. Lau, P. Chen and Y. L. Guan, "Design Guidelines of Low-Density Parity-Check Codes for Magnetic Recording Systems," in IEEE Communications Surveys & Tutorials, vol. 20, No. 2, pp. 1574-1606, Secondquarter2018, doi: 10.1109/COMST.2018.2797875.

F. Babich, M. Noschese, A. Soranzo and F. Vatta, "Low complexity rate compatible puncturing patterns design for LDPC codes," 2017 25th International Conference on Software, Telecommunications and Computer Networks (SoftCOM), 2017, pp. 1-5, doi: 10.23919/SOFTCOM.2017.8115558.

\* cited by examiner

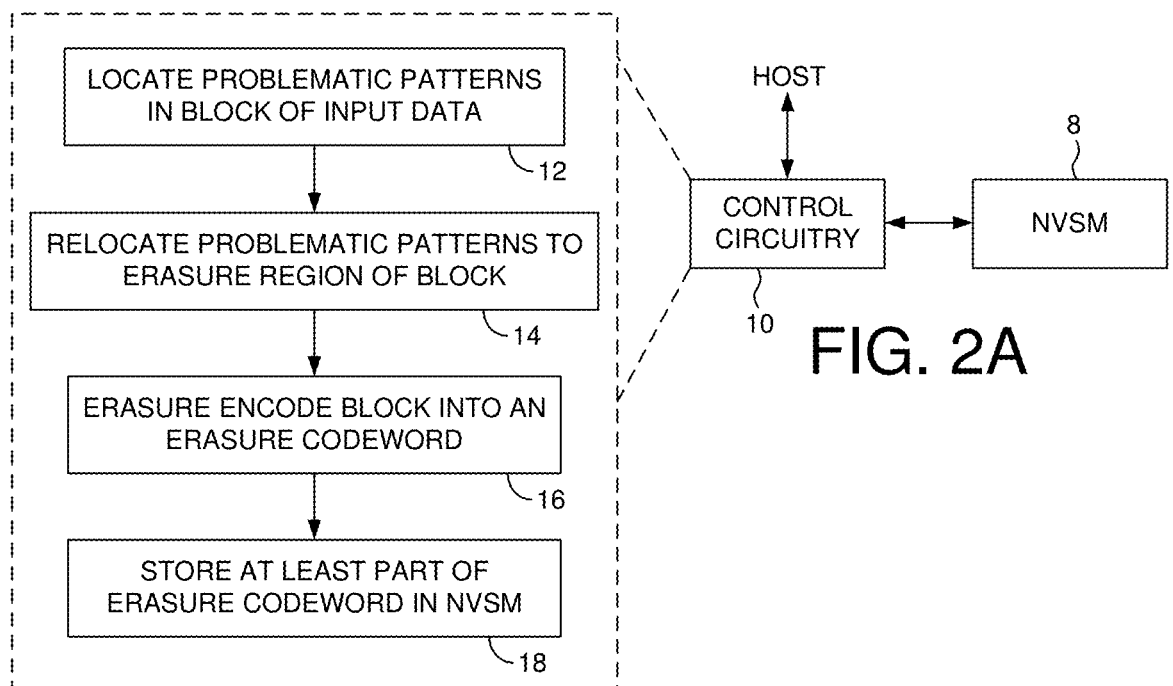
FIG. 2A
FIG. 2B
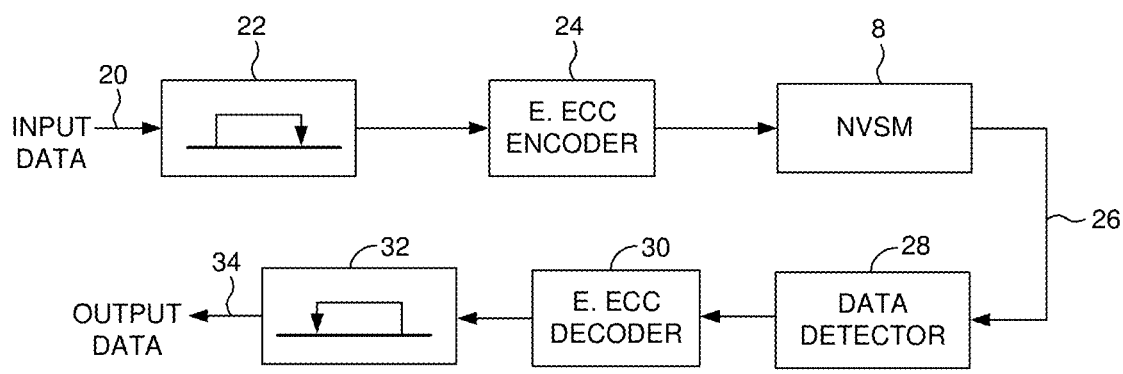
FIG. 2C

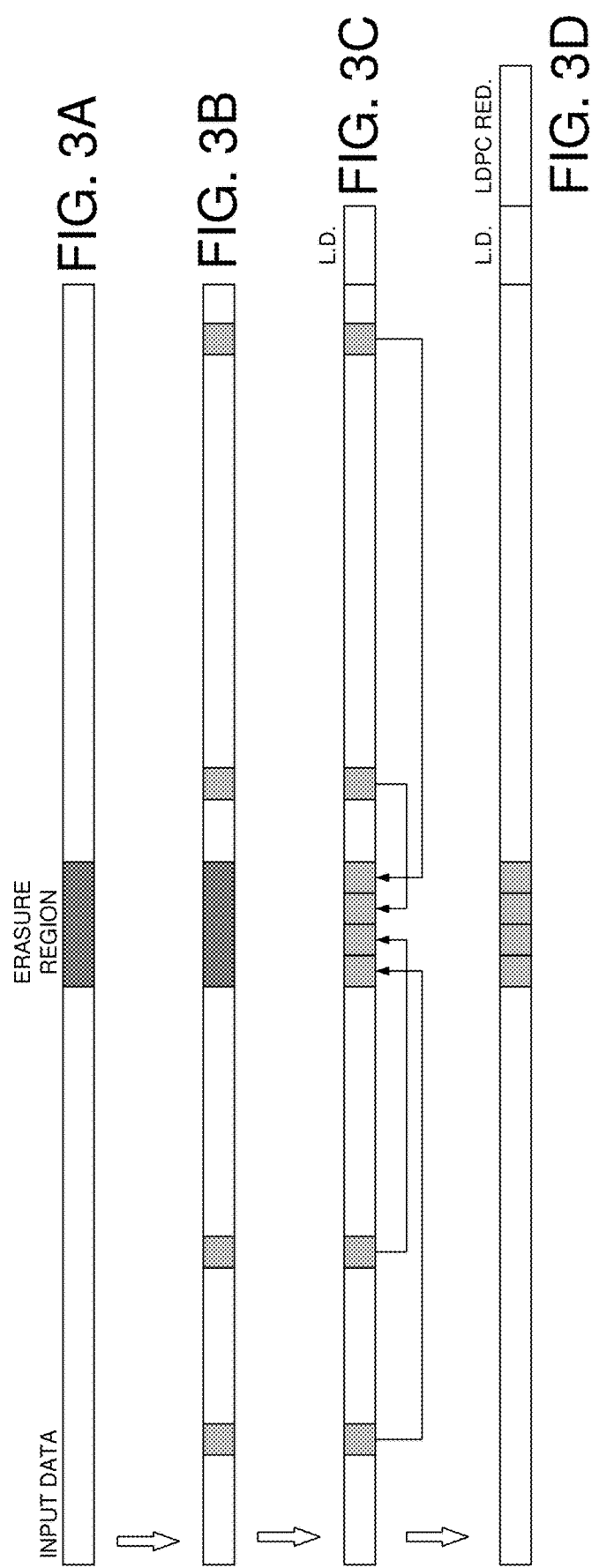

US 11,513,895 B1

DATA STORAGE DEVICE PROCESSING PROBLEMATIC PATTERNS AS ERASURES

BACKGROUND

Data storage devices such as disk drives, tape drives, and solid state drives typically employ some form of error correction code (ECC) capable of correcting errors when reading the recorded data from the storage medium, thereby compensating for signal noise that is inherent with every recording/reproduction channel. During a write operation, redundancy symbols are generated and appended to user data which are then processed during a corresponding read operation in order to detect and correct errors in the user data.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the symbols of a single codeword, or in other embodiments, each data sector may store symbols from multiple codewords (i.e., interleaved codewords). FIG. 1B shows a prior art die format for a solid state drive, wherein each die may store multiple pages and each page may store multiple blocks each corresponding to a data sector, and the pages may be grouped into erase blocks for garbage collection and wear leveling management. FIG. 1C shows a magnetic tape which may be recorded as longitudinal data tracks using a head bar comprising multiple write/read elements, wherein codewords may be written to the data tracks using any suitable format (sequential, interleaved, distributed, etc.).

BRIEF DESCRIPTION OF THE DRAWINGS

FIG. 2A shows a data storage device according to an embodiment comprising control circuitry and a non-volatile storage medium (NVSM).

FIG. 2B is a flow diagram according to an embodiment wherein problematic patterns are moved to an erasure region of a block of input data before erasure encoding the block into an erasure codeword.

FIG. 2C shows control circuitry according to an embodiment wherein problematic patterns are effectively removed from an input block before erasure encoding, recovered using erasure decoding, and then re-inserted into the decoded output block.

FIGS. 3A-3D show an embodiment wherein the erasure codeword is a punctured low density parity check (LDPC) codeword.

DETAILED DESCRIPTION

Figure 1A:
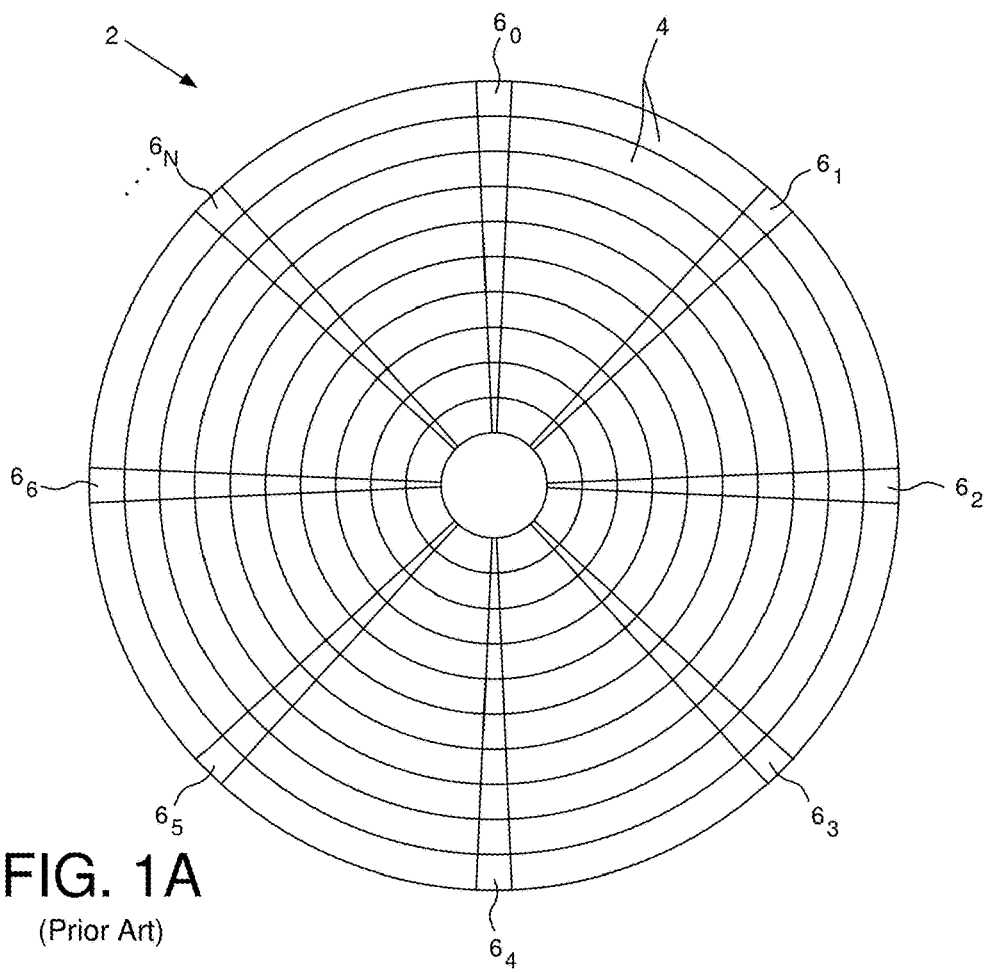
FIG. 1A shows a prior art disk format comprising a plurality of servo tracks defined by servo sectors.
Figure 1B:
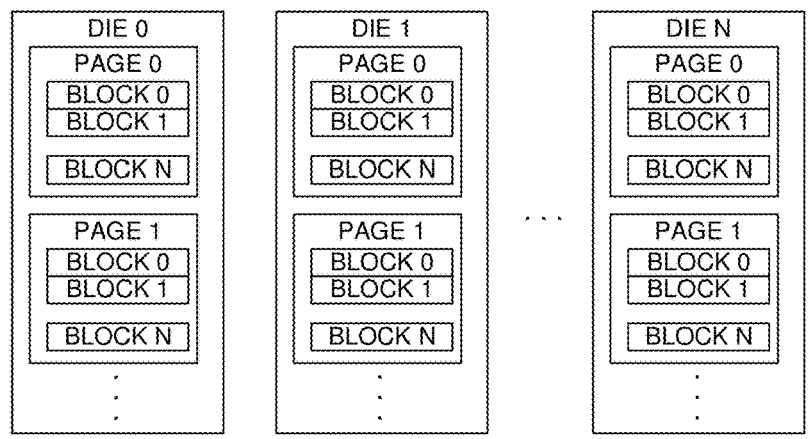
FIG. 1B shows a prior art solid state drive format comprising a plurality of dies each comprising a plurality of pages.
Figure 1C:
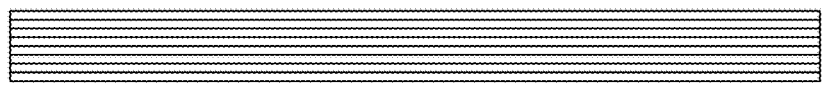
FIG. 1C shows a prior art magnetic tape comprising a plurality of longitudinal data tracks.

FIG. 2A shows a data storage device according to an embodiment comprising a non-volatile storage medium (NVSM) 8, and control circuitry 10 configured to execute the flow diagram of FIG. 2B. The data storage device may include one or more types of NVSM, including rotating magnetic media (e.g., a hard disk drive), magnetic tape media (e.g., tape drive), and solid state memory (e.g., a solid state drive), such as those shown in FIGS. 1A-C. While the description herein refers to solid state memory generally, it is understood that solid state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., Single-Level Cell (SLC) memory, Multi-Level Cell (MLC) memory, TLC, QLC, etc., or any combination thereof), NOR memory, EEPROM, Ferroelectric Memory (FeRAM), Magneto-resistive RAM (MRAM), other discrete NVM chips, or any combination thereof. Problematic patterns in a block of input data are identified (block 12), and the problematic patterns are relocated from an initial location to an erasure region of the block to generate a modified block (block 14). The modified block is erasure encoded into an erasure codeword (block 16), and at least part of the erasure codeword is stored in the NVSM (block 18).

In one embodiment, certain patterns in a block of input data may be considered problematic in that they may decrease the signal-to-noise ratio (SNR) during the recording and/or readback operations. An example of a problematic pattern may be a pattern that results in a high frequency pattern of magnetic transitions recorded on a magnetic media. In one embodiment, a problematic pattern may consist of any length of bits, such as a length that spans one or more symbols of the erasure codeword. In one embodiment, at least some problematic patterns are effectively removed from an input block prior to storing the input block in the NVSM 8, and during a read operation of the block, the problematic patterns are decoded (regenerated) by decoding the erasure codeword. In this manner, the loss of SNR associated with writing/reading at least some of the problematic patterns is avoided. In one embodiment described below, the problematic patterns removed from an input block may be replaced with an assistive pattern having an increased propensity for higher SNR during the writing/reading process, thereby improving the chances of successfully decoding the erasure codeword.

FIG. 2C shows control circuitry according to an embodiment wherein a block of input data 20 is processed at block 22 in order to move at least some problematic patterns from initial locations to an erasure region so as to effectively remove the problematic patterns from the input block 20. The modified input block and the problematic patterns are then processed by an erasure error correction code (ECC) encoder 24 to generate an erasure codeword which includes the problematic patterns in an erasure region. The erasure codeword minus the erasure region is then stored in the NVSM 8; that is, the relocated problematic patterns are not written to or read from the NVSM 8, thereby avoiding the associated loss in SNR. During a read operation, the partial erasure codeword is read from the NVSM and the resulting read signal 26 processed by a suitable data detector 28 (e.g., a Viterbi detector). The output of the data detector 28 is processed by a suitable erasure ECC decoder 30 which decodes the entire erasure codeword, including the erasure region containing the problematic patterns. The decoded erasure codeword is processed at block 32 in order to relocate the problematic patterns from the erasure region to their initial locations to regenerate the block of input data 20 (i.e., so that the output data 34 matches the input data 20).

Any suitable erasure ECC encoder 24 may be employed in the embodiments disclosed herein in order to encode an input block into an erasure codeword. FIGS. 3A-3D show an embodiment wherein the input block is encoded into an erasure codeword based on a punctured low density parity check (LDPC) code. With a punctured LDPC code, part of the input block is processed as an erasure region such as shown in FIG. 3A meaning that the corresponding symbols are not stored in the NVSM 8 but are instead processed as erasures during the decoding process in order to regenerate the symbols. In on embodiment, at least some problematic patterns represented as shaded segments in FIG. 3B are moved to the erasure region as shown in FIG. 3C. In one embodiment, the problematic patterns may be replaced with the corresponding patterns in the erasure region, and in another embodiment the symbols in the erasure region may be "pushed up" or "pushed down" by shifting the symbols left or right within the input block as part of relocating the problematic patterns. In one embodiment, location data (L.D.) of the problematic patterns may be maintained in order to relocate the problematic patterns to their initial locations after erasure decoding during a read operation. The location data may be stored in any suitable non-volatile storage medium, such as the NVSM 8, wherein in an embodiment shown in FIG. 3C, the location data may be appended to the input block prior to encoding the input block into the erasure codeword. The LDPC parity bits (LDPC RED.) are then generated over the input block shown in FIG. 3C in order to generate an erasure codeword including the erasure region that stores the problematic patterns as shown in FIG. 3D. The erasure codeword minus the erasure region is then stored in the NVSM 8, and during a read operation the erasure decoder decodes the punctured LDPC codeword so as to regenerate the problematic patterns (as well as decode the location data). The decoded location data is then used to relocate the decoded problematic patterns to their initial locations in the input block. Although in the embodiment of FIG. 3A the erasure region of the input block is shown as a contiguous segment, in other embodiments the erasure region may be distributed throughout the input block.

Figure 4A:
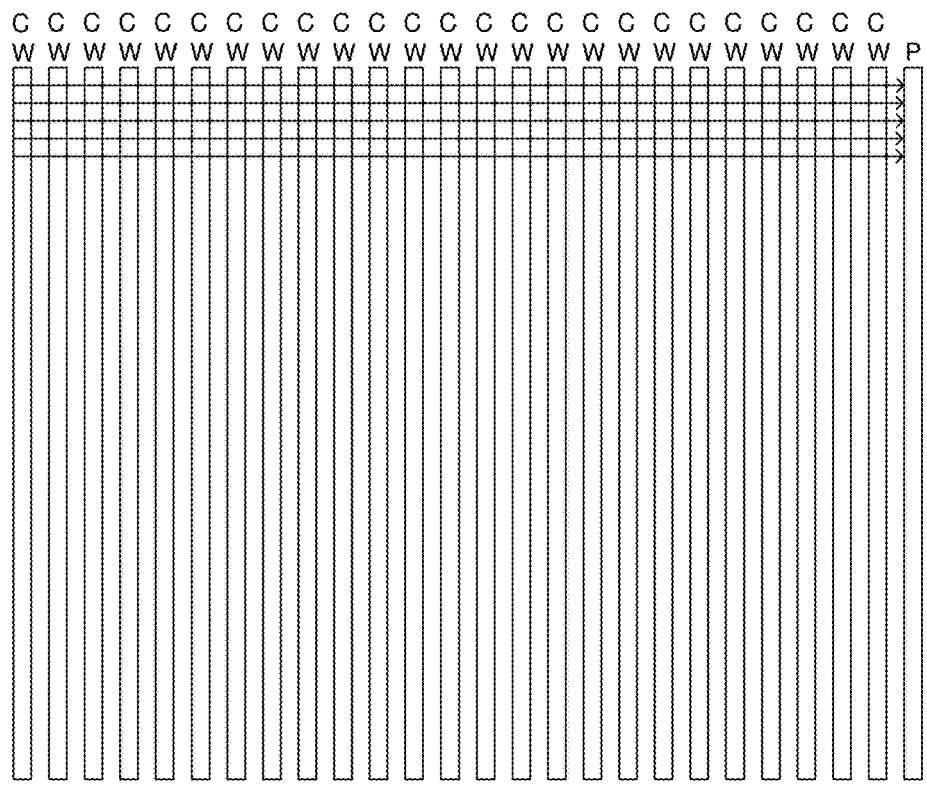
FIG. 4A shows a prior art parity block codeword generated over a plurality of sub-block codewords.

In another embodiment, the erasure codeword may be a parity block codeword generated over a plurality of sub-block codewords. FIG. 4A shows a prior art parity block codeword wherein a parity block (P) is generated over a plurality of sub-block codewords (CW). When decoding the parity block codeword, the parity block (P) is used conventionally to recover one or more of the sub-block codewords (CW) that are unrecoverable at the sub-block level. For example, in one embodiment each sub-block codeword (CW) may be a conventional LDPC codeword that is decoded using an iterative decoder. When the iterative decoder fails to decode the LDPC codeword, the parity block (P) may be processed to help recover the LDPC codeword.

Figure 4B:
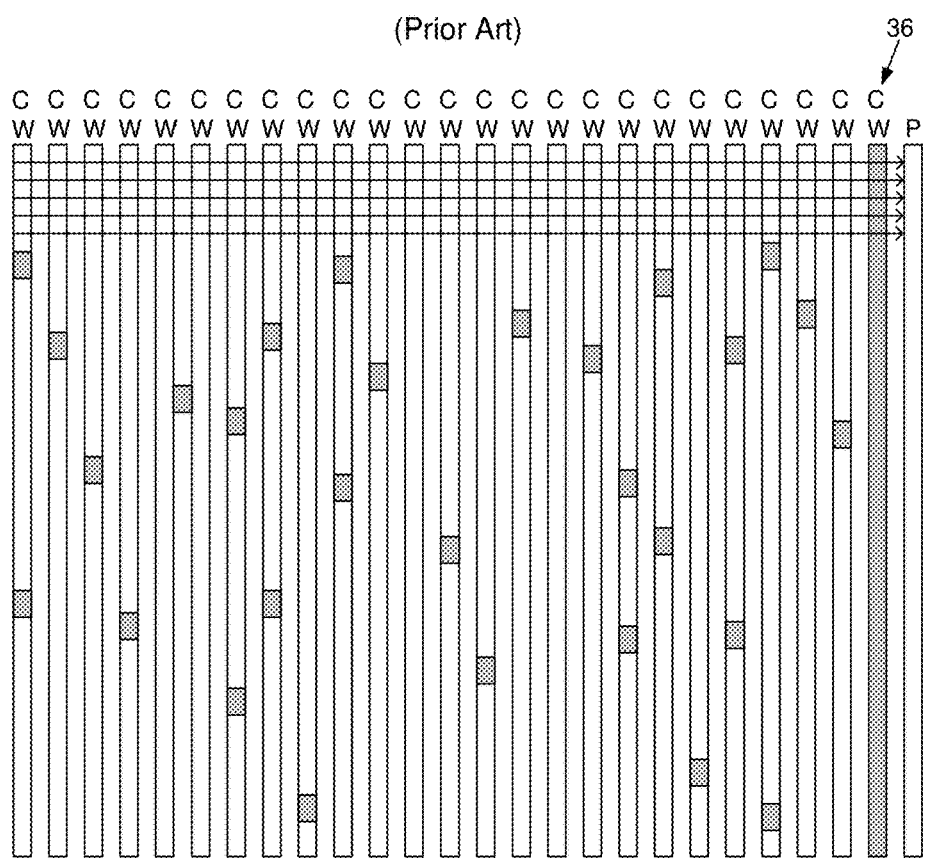
FIG. 4B shows an embodiment wherein the erasure codeword is a parity block codeword generated over a plurality of sub-block codewords including at least one sub-block codeword designated as an erasure region.

FIG. 4B shows an embodiment wherein at least one sub-block codeword (CW 36) of a parity block codeword is designated as an erasure region wherein problematic patterns (shown as shaded segments in FIG. 4B) are moved to the erasure region (CW 36) prior to encoding the sub-block codewords and the parity block codeword. In one embodiment, the erasure region (CW 36) may initially store payload data (e.g., user data) which may be swapped with problematic patterns identified in other sub-block codewords similar to the embodiment described above with reference to FIGS. 3A-3D. That is, in one embodiment the conventional parity block codeword of FIG. 4A may be rearranged so that one of the sub-block codewords (e.g., CW 36 in FIG. 4B) is used to store at least some of the problematic patterns identified across all of the sub-block codewords.

In another embodiment, the erasure region (CW 36) may be empty initially and then filled with the problematic patterns identified in the other sub-block codewords. In one embodiment, the problematic patterns shown in FIG. 4B may be replaced with assistive patterns known to improve the SNR during the recording and/or readback operations. Accordingly in this embodiment, the assistive patterns may improve the probability of recovering the sub-block codewords at the sub-block level (e.g., recovering an LDPC codeword at the sub-block level). In one embodiment, the erasure region (CW 36) of FIG. 4B is not stored to the NVSM 8 but is instead regenerated during a read operation using the other decoded sub-block codewords (CWs) and the parity block (P). For example, in one embodiment replacing the problematic patterns in the sub-block codewords (CWs) with assistive patterns may help recover the sub-block codewords at the sub-block level, which may then be used together with the parity block (P) to decode the erasure region (CW 36) and thereby regenerate the problematic patterns. Location data may then be used to replace the assistive patterns in the sub-block codewords (CWs) with the corresponding problematic patterns in order to regenerate the input data. In one embodiment, the location data may be added to the erasure region (CW 36) prior to encoding the parity block codeword and then regenerated together with the problematic patterns when decoding the erasure region (CW 36).

In one embodiment, the erasure region (CW 36) may be stored to the NVSM 8 and decoded at the sub-block level during a read operation in order to assist in the overall decoding of the parity block codeword. In yet another embodiment, the sub-block codewords shown in FIG. 4B that are not part of the erasure region may be stored in a first, lower reliability NVSM (e.g., a magnetic media) whereas the erasure region (CW 36) may be stored in a second, higher reliability NVSM (e.g., a Flash memory) that is less susceptible to the problematic patterns. It is noted that the schematics in FIGS. 4A-4B may represent data placed on tracks such as on magnetic media of hard disk drives or tape drives, or placed in memory cells in various types of solid state memory described above.

In an embodiment where the problematic patterns in a sub-block codeword are replaced with assistive patterns as described above, the assistive patterns may consist of a sequence not seen in the normal payload data (e.g., user data). An example of a sequence not seen in the normal payload data is a sync mark used to symbol synchronize a sub-block codeword. Accordingly in this embodiment when an assistive pattern is detected in a sub-block codeword during decoding of the erasure codeword, the assistive pattern is replaced with the corresponding problematic pattern (e.g., stored in the erasure region). Also in this embodiment, it may not be necessary to store location data for the problematic patterns since the location of the assistive pattern within the sub-block codeword becomes the location data for the problematic pattern. That is when an assistive pattern is detected in a sub-block codeword during decoding of the erasure codeword, the assistive pattern is replaced with the next problematic pattern when the problematic patterns are stored in a consecutive order (e.g., in the erasure region).

In the embodiment of FIG. 4B, the parity block codeword comprises a single parity block (P) generated over multiple sub-block codewords (e.g., LDPC codewords), whereas other embodiments may employ multiple parity blocks generated, for example, over different interleaves of multiple sub-block codewords. That is, other embodiments may employ any suitable two-dimensional encoding scheme to encode a plurality of sub-block codewords into any suitable erasure codeword. In yet other embodiments, additional erasure coding may be employed (e.g., a super-block codeword generated over multiple erasure codewords) in order to recover one or more sub-block codewords unrecoverable at the sub-block level (e.g., due to a long media defect).

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the NVSM and read into a volatile semiconductor memory when the data storage device is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile storage medium (NVSM); and
control circuitry configured to:
identify problematic patterns in a block of input data, the problematic patterns involving a decreased signal-to-noise ratio (SNR);
relocate the problematic patterns from one or more initial locations to an erasure region of the block to generate a modified block;
erasure encode the modified block into an erasure codeword;
store at least part of the erasure codeword in the NVSM;
read the at least part of the erasure codeword from the NVSM;
erasure decode the erasure codeword to decode the problematic patterns of the erasure region; and
use stored location data for the problematic patterns in order to relocate the problematic patterns from the erasure region to the one or more initial locations to regenerate the block of input data.

2. The data storage device as recited in claim 1, wherein the erasure region of the block is not stored in the NVSM.

3. The data storage device as recited in claim 1, wherein the control circuitry is further configured to store location data of the one or more initial locations of the problematic patterns in the NVSM.

4. The data storage device as recited in claim 1, wherein the erasure codeword is a punctured low density parity check (LDPC) codeword.

5. The data storage device as recited in claim 1, wherein the erasure codeword is a parity block codeword generated over a plurality of sub-block codewords.

6. The data storage device as recited in claim 5, wherein each sub-block codeword is a low density parity check (LDPC) codeword.

7. The data storage device as recited in claim 5, wherein the control circuitry is further configured to replace the problematic patterns at the one or more initial locations with predetermined patterns prior to erasure encoding the modified block into the erasure codeword.

8. The data storage device as recited in claim 1, wherein the control circuitry is further configured to replace the problematic patterns at the one or more initial locations with predetermined patterns prior to erasure encoding the modified block into the erasure codeword.

9. A data storage device comprising:
a non-volatile storage medium (NVSM); and
control circuitry configured to:

remove problematic patterns from a block of input data to generate a modified block, the problematic patterns involving a decreased signal-to-noise ratio (SNR);

erasure encode the modified block and the problematic patterns into an erasure codeword;

store at least part of the erasure codeword in the NVSM; and read the at least part of the erasure codeword from the NVSM;

erasure decode the erasure codeword to decode the problematic patterns; and use the decoded problematic patterns and stored location data for the problematic patterns in order to regenerate the block of input data.

10. The data storage device as recited in claim 9, wherein the problematic patterns of the block are not stored in the NVSM.

11. The data storage device as recited in claim 9, wherein the control circuitry is further configured to store location data of the problematic patterns in the NVSM.

12. The data storage device as recited in claim 9, wherein the erasure codeword is a punctured low density parity check (LDPC) codeword.

13. The data storage device as recited in claim 9, wherein the erasure codeword is a parity block codeword generated over a plurality of sub-block codewords.

14. The data storage device as recited in claim 13, wherein each sub-block codeword is a low density parity check (LDPC) codeword.

15. The data storage device as recited in claim 13, wherein the control circuitry is further configured to replace the problematic patterns with predetermined patterns prior to erasure encoding the modified block into the erasure codeword.

16. The data storage device as recited in claim 9, wherein the control circuitry is further configured to replace the problematic patterns with predetermined patterns prior to erasure encoding the modified block into the erasure codeword.

17. A data storage device comprising:
a non-volatile storage medium (NVSM); and
a means for removing problematic patterns from a block of input data to generate a modified block, the problematic patterns involving a decreased signal-to-noise ratio (SNR);

a means for erasure encoding the modified block and the problematic patterns into an erasure codeword; and a means for storing at least part of the erasure codeword in the NVSM.

18. A data storage device comprising:
a non-volatile storage medium (NVSM); and
control circuitry configured to:
identify problematic patterns in a block of input data, the problematic patterns involving a decreased signal-to-noise ratio (SNR);

relocate the problematic patterns from one or more initial locations to an erasure region of the block to generate a modified block;

replace the problematic patterns at the one or more initial locations with predetermined patterns;

erasure encode the modified block into an erasure codeword, wherein the problematic patterns are replaced with the predetermined patterns prior to the erasure encoding the modified block into the erasure codeword; and store at least part of the erasure codeword in the NVSM.

19. The data storage device as recited in claim 18, wherein the erasure codeword is a parity block codeword generated over a plurality of sub-block codewords.

20. A data storage device comprising:
a non-volatile storage medium (NVSM); and
control circuitry configured to:
remove problematic patterns from a block of input data to generate a modified block, the problematic patterns involving a decreased signal-to-noise ratio (SNR);

replace the problematic patterns with predetermined patterns;

erasure encode the modified block and the problematic patterns into an erasure codeword, wherein the problematic patterns are replaced with the predetermined patterns prior to the erasure encoding the modified block into the erasure codeword; and store at least part of the erasure codeword in the NVSM.

21. The data storage device as recited in claim 20, wherein the erasure codeword is a parity block codeword generated over a plurality of sub-block codewords.

* * * * *